United States Patent
Baek

(10) Patent No.: US 9,396,779 B2
(45) Date of Patent: Jul. 19, 2016

(54) SEMICONDUCTOR MEMORY DEVICE AND OPERATION METHOD THEREOF

(71) Applicant: SK hynix Inc., Gyeonggi-do (KR)

(72) Inventor: Chang-Ki Baek, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/522,319

(22) Filed: Oct. 23, 2014

(65) Prior Publication Data

US 2015/0287448 A1 Oct. 8, 2015

(30) Foreign Application Priority Data

Apr. 4, 2014 (KR) .......................... 10-2014-0040271

(51) Int. Cl.
*G11C 7/06* (2006.01)
*G11C 7/22* (2006.01)
*G11C 7/20* (2006.01)
*G11C 7/10* (2006.01)
*G11C 29/02* (2006.01)

(52) U.S. Cl.
CPC .............. *G11C 7/222* (2013.01); *G11C 7/1093* (2013.01); *G11C 7/20* (2013.01); *G11C 29/023* (2013.01); *G11C 29/028* (2013.01); *G11C 2207/2254* (2013.01)

(58) Field of Classification Search
CPC ........ G11C 7/222; G11C 7/20; G11C 7/1093; G11C 29/023; G11C 29/028

USPC ...................................... 365/189.07; 327/144
See application file for complete search history.

(56) References Cited

U.S. PATENT DOCUMENTS

| | | | |
|---|---|---|---|
| 2007/0001726 A1* | 1/2007 | Lee ........................ | H03K 5/13 327/175 |
| 2009/0146700 A1* | 6/2009 | Kim ..................... | H03K 5/1565 327/144 |
| 2009/0289658 A1* | 11/2009 | Moon .................... | G11C 5/063 326/30 |
| 2011/0163778 A1* | 7/2011 | Moon .................... | G11C 5/063 326/30 |
| 2011/0215851 A1* | 9/2011 | Oh .......................... | H03L 7/06 327/158 |
| 2012/0007630 A1* | 1/2012 | Moon ................ | H03K 19/0005 326/30 |

FOREIGN PATENT DOCUMENTS

KR 1020120005291 1/2012

* cited by examiner

*Primary Examiner* — Toan Le
(74) *Attorney, Agent, or Firm* — IP & T Group LLP

(57) ABSTRACT

A semiconductor memory device includes a clock input block suitable for generating first and second internal clocks in response to an external clock, a clock correction block suitable for generating a data clock by correcting a duty ratio of the first and second internal clocks in response to a signal activated in an initial operation mode of the semiconductor memory device, and a data control block suitable for controlling data in synchronization with the data clock.

18 Claims, 3 Drawing Sheets

SEMICONDUCTOR MEMORY DEVICE AND OPERATION METHOD THEREOF

CROSS-REFERENCE TO RELATED APPLICATIONS

The present application claims priority of Korean Patent Application No. 10-2014-0040271, filed on Apr. 4, 2014, which is incorporated herein by reference in its entirety.

BACKGROUND

1. Field

Exemplary embodiments of the present invention relate to a semiconductor memory device and, more particularly, to a semiconductor memory device correcting the duty ratio of an internal clock depending on an operation mode and an operation method thereof.

2. Description of the Related Art

With the expanding mobile market, there is a constant demand for miniaturized mobile electronic devices that operate on the limited capacity of a battery. Semiconductor devices used in mobile electronic devices are developed to have high performance while using low power. Therefore, reducing the current consumption in static and dynamic states is an important subject of development in semiconductor memory device of mobile electronic devices.

FIG. 1 is a block diagram illustrating the layout of a typical semiconductor memory device. A semiconductor memory device 100 having an edge pad structure is shown as an example.

Referring to FIG. 1, the semiconductor memory device 100 may include a cell array block 110 and a peripheral circuit block 120 and 130. The cell array block 110 may include a plurality of cell arrays disposed in the center of the semiconductor memory device 100 (i.e. a memory chip). The peripheral circuit block may include first and second peripheral circuit blocks 120 and 130 respectively disposed at the top and bottom of the cell array block 110. When the first peripheral circuit block 120 includes a command/address input pad 140 and a clock input pad 150, the second peripheral circuit block 130 may include a data input/output pad 160.

The semiconductor memory device 100 having the structure described above may operate in synchronization with a clock signal. That is, the semiconductor memory device 100 may exchange data with external devices in response to the clock signal. The clock signal and the data are transmitted through the dock input pad 150 and the data input/output pad 160, i.e., edge pads. In the edge pad structure of the semiconductor memory device 100, however, the clock input pad 150 is disposed a long distance from the data input/output pad 160 and relative circuits since they are disposed at both edges, respectively. The clock signal is to be transmitted through a long transmission path to be used for inputting/outputting the data (Referring to an arrow shown in FIG. 1).

The farther the clock signal is transmitted, the more the dock signal is delayed. A delayed clock signal may influence the characteristics of data outputted from semiconductor memory devices. As semiconductor memory devices operate at high speed and use high frequency clock signals, the influence of delayed clock signals increases. Especially in semiconductor memory devices used in mobile systems supplied with limited power, the operating current may increase and deteriorate operating properties when a correction circuit is employed to correct such clock signals.

SUMMARY

An embodiment of the present invention is directed to a semiconductor memory device correcting the duty ratio of an internal clock depending on an operation mode and a method of correcting the duty ratio of the internal clock.

In accordance with an embodiment of the present invention, a semiconductor memory device includes a clock input block suitable for generating first and second internal clocks in response to an external clock, a clock correction block suitable for generating a data clock by correcting a duty ratio of the first and second internal clocks in response to a signal activated in an initial operation mode of the semiconductor memory device, and a data control block suitable for controlling data in synchronization with the data clock.

In accordance with another embodiment of the present invention, a method of operating a semiconductor memory device includes generating first and second internal docks in response to rising and falling edges of an external dock, correcting a duty ratio of the first and second internal docks to generate a data dock in an initial operation mode of the semiconductor memory device, and controlling data in synchronization with the data dock.

In accordance with a further embodiment of the present invention, a semiconductor memory device includes a clock correction block suitable for generating a data clock by correcting a duty ratio of an input clock in an initial operation period or a test operation period of the semiconductor memory device, and a data control block suitable for controlling data in synchronization with the data clock.

DETAILED DESCRIPTION

Figure 1:
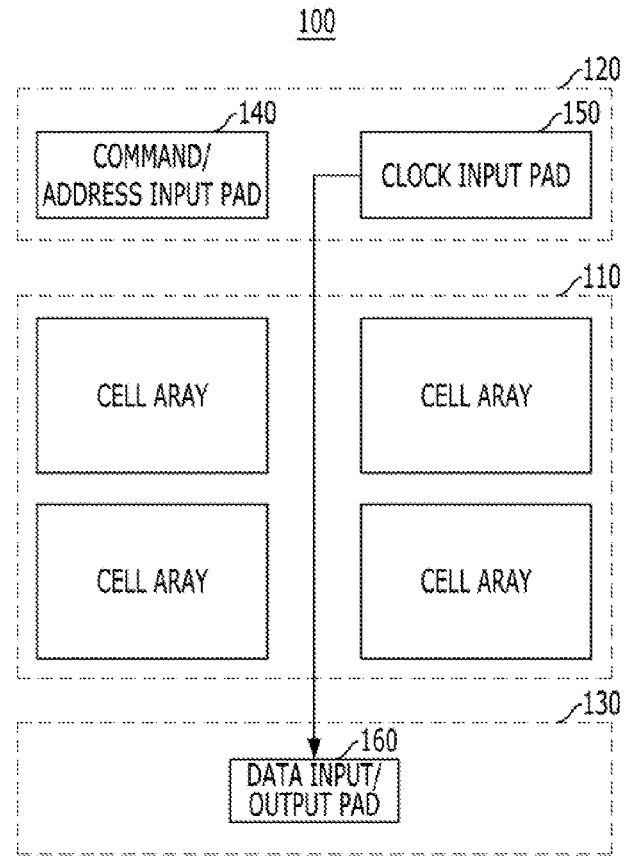
FIG. 1 is a block diagram illustrating the layout of a typical semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
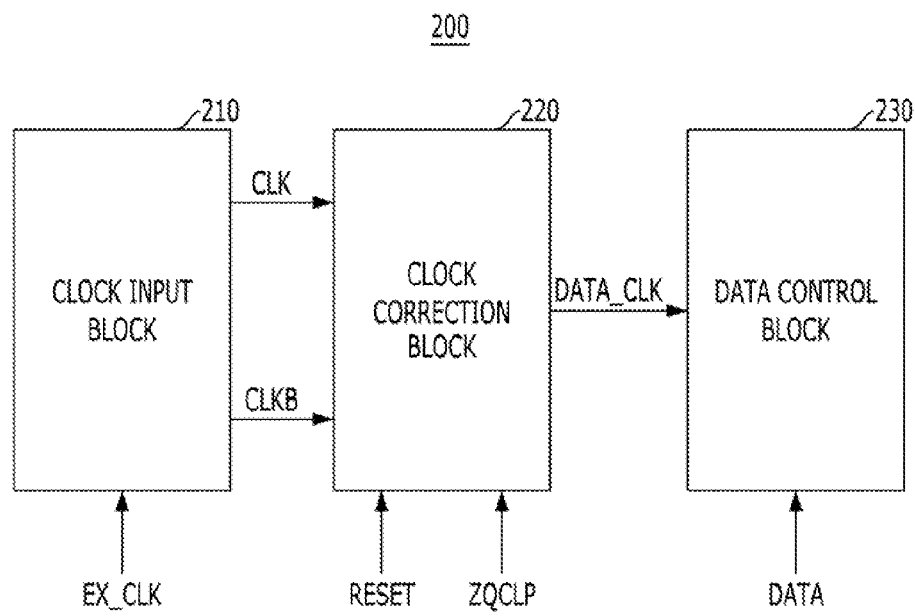
FIG. 2 is a block diagram illustrating a semiconductor memory device in accordance with an embodiment of the present invention.

FIG. 2 is a block diagram illustrating a semiconductor memory device 200 in accordance with an embodiment of the present invention. Referring to FIG. 2, the semiconductor memory device 200 in accordance with the embodiment of the present invention includes a dock input block 210, a clock correction block 220, and a data control clock 230.

The dock input block 210 receives an external clock EX_CLK and generates first and second internal clocks CLK and CLKB. The first internal clock CLK may be a clock signal synchronized with a rising edge of the external clock EX_CLK, and the second internal clock CLKB may be a clock signal synchronized with a falling edge thereof.

The dock correction block 220 receives the first and second internal clocks CLK and CLKB outputted from the clock input block 210 and outputs a data clock DATA_CLK. The data clock DATA_CLK has a duty ratio of an active period to inactive period corrected at 5:5 (i.e., a duty cycle of 50%). The clock correction block 220 may operate in response to a signal activated in an initial operation mode of the semiconductor memory device 200. The initial operation mode corresponds to an operation period where default values of the semiconductor memory device 200 are set after the semiconductor memory device 200 is powered up. Therefore, the clock correction block 220 may stably perform a correction operation of a clock duty ratio in the initial operation mode.

For example, the clock correction block 220 may operate in response to an initialization signal RESET and a ZQ calibration signal ZQCLP. The initialization signal RESET may be a power up reset signal of the semiconductor memory device 200. The clock correction block 220 may reset an operation of correcting the duty ratio of the first and second internal clocks CLK and CLKB in response to the initialization signal RESET.

The ZQ calibration signal ZQCLP is a signal for a ZQ calibration operation of the semiconductor memory device 200. In the ZQ calibration operation, the semiconductor memory device 200 adjusts its impedance using a resistance element, which is coupled to a ZQ pad, and so on. The ZQ calibration signal ZQCLP may be generated for a ZQ calibration operation first performed after the semiconductor memory device 200 is powered up. The clock correction block 220 may perform the correction operation of the clock duty ratio during the active period of the ZQ calibration signal ZQCLP, i.e., the period of the ZQ calibration operation (Referring to tZQINT in FIG. 5). Therefore, sufficient time may be secured for the correction operation without increasing peak current.

As described above, the initialization signal RESET and the ZQ calibration signal ZQCLP are signals activated in an initial operation period of the semiconductor memory device 200. In accordance with the embodiment of the preset invention, the semiconductor memory device 200 may correct the duty ratio of the clock in a period where the semiconductor memory device does 200 does not perform general operations such as read and write operations. The semiconductor memory device 200 may stably perform data input/output operations without increasing its peak current even in a low power system such as a mobile product.

In a semiconductor memory device in accordance with another embodiment of the present invention, the clock correction block 220 may correct the duty ratio of the first and second internal clocks CLQ and CLKB in response to a test signal for controlling a test mode. The test mode of the semiconductor memory device may be set to correspond to an operation period other than general read/write operation periods.

The data control block 230 may perform data input/output operations based on the data clock DATA_CLK outputted from the clock correction block 220. In accordance with an embodiment of the present invention, the semiconductor memory device 200 may correct the duty ratio of the clock for each byte of inputted/outputted data. That is, the clock correction block 220 may be arranged on the basis of the byte of the data. For example, in a semiconductor memory device inputting/outputting data through 32 I/O pins, a clock correction block may be arranged every 8 I/O pins.

Hereafter, the structure of the clock correction block 220 will be described in more detail in accordance with the embodiment of the present invention.

Figure 3:
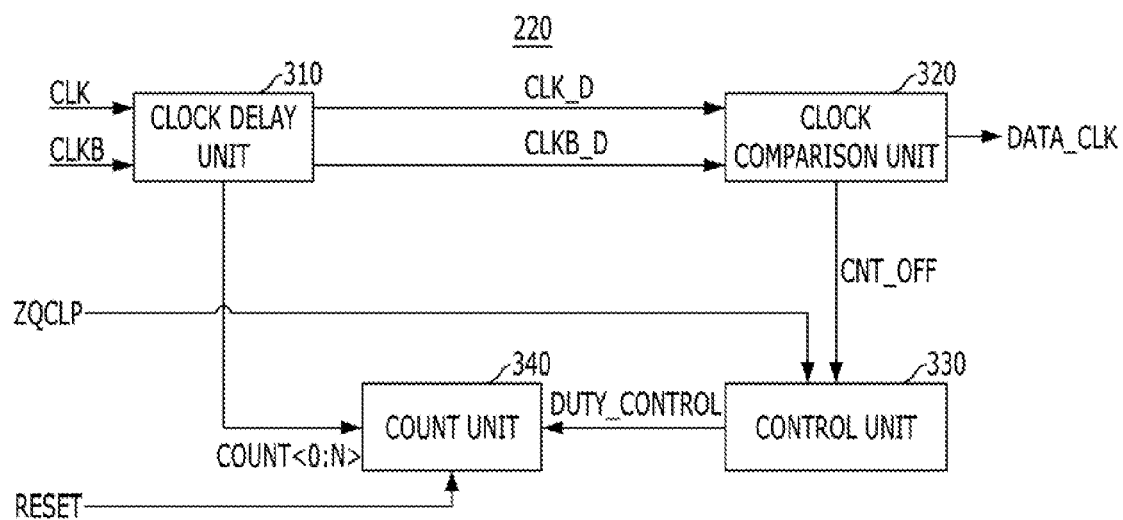
FIG. 3 is a block diagram illustrating a clock correction block shown in FIG. 2 in accordance with the embodiment of the present invention.

FIG. 3 is a block diagram illustrating the structure of the clock correction block 220 shown in FIG. 2 in accordance with the embodiment of the present invention. Referring to FIG. 3, the clock correction block 220 in accordance with the embodiment of the present invention may include a clock delay unit 310, a clock comparison unit 320, a control unit 330, and a count unit 340.

The clock delay unit 310 generates first and second delay clocks CLK_D and CLKB_D by delaying first and second internal clocks CLK and CLKB in response to a count signal COUNT<0:N> outputted from the count unit 340. The dock delay unit 310 includes a plurality of delay units corresponding to bits of the count signal COUNT<0:N>. That is, the clock delay unit 310 may include N+1 delay units. Each of the delay units is activated in response to a corresponding bit and delays the first and second internal clocks CLK and CLKB. Therefore, the delay amount of the clock delay unit 310 is determined depending on bit values of the count signal COUNT<0:N>. The first and second internal clocks CLK and CLKB are delayed based on the determined delay amount to generate the first and second delay clocks CLK_D and CLKB_D. Since a delay circuit having such a structure in which the delay amount is determined in response to a bit signal is well known, a detailed description thereof is omitted.

The clock comparison unit 320 compares the first and second delay clocks CLK_D and CLKB_D and generates a completion signal CNT_OFF. The clock comparison unit 320 may deactivate the completion signal CNT_OFF when the active and inactive periods of each of the first and second delay clocks CLK_D and CLKB_D are different lengths of periods. The clock comparison unit 320 may activate and output the completion signal CNT_OFF when the active and inactive periods of each of the first and second delay clocks CLK_D and CLKB_D have the same length of period. The clock comparison unit 320 may output one of the first and second delay clocks CLK_D and CLKB_D as the data clock DATA_CLK.

The control unit 330 may generate a control signal DUTY_CONTROL in response to the completion signal CNT_OFF and the ZQ calibration signal ZQCLP. The control unit 330 activates the control signal DUTY_CONTROL and enables the count unit 340 in the active period of the ZQ calibration signal ZQCLP. The control unit 330 deactivates the control signal DUTY_CONTROL and disables the count units 340 when the completion signal CNT_OFF is activated.

Although the control unit 330 is described to operate in response to the ZQ calibration signal ZQCLP in FIG. 3, it is only an embodiment of the present invention and the present invention is not limited thereto. The control unit 330 may operate in response to a signal activated in an initial operation mode of the semiconductor memory device 200. In accordance with another embodiment of the present invention, the operation of the clock correction block 220 may be controlled in response to a test signal activated in a test mode of the semiconductor memory device 200. Therefore, the semiconductor memory device 200 in accordance with the embodiment of the present invention may correct the duty ratio of the clock in an operation period wherein a general operation, such as read/write operations, is not performed.

In response to the control signal DUTY_CONTROL outputted from the control unit 330, the count unit 340 performs a counting operation and outputs the count signal COUNT<0:N>. The count unit 340 embodies a plurality of flip-flops FF, and a detailed structure of the count unit 340 will be described with reference to FIG. 4. The count signal COUNT 0:N> generated in the count unit 340 is inputted to the clock delay unit 310 to determine the delay amount of the first and second internal clocks CLK and CLKB, as described above.

Figure 4:
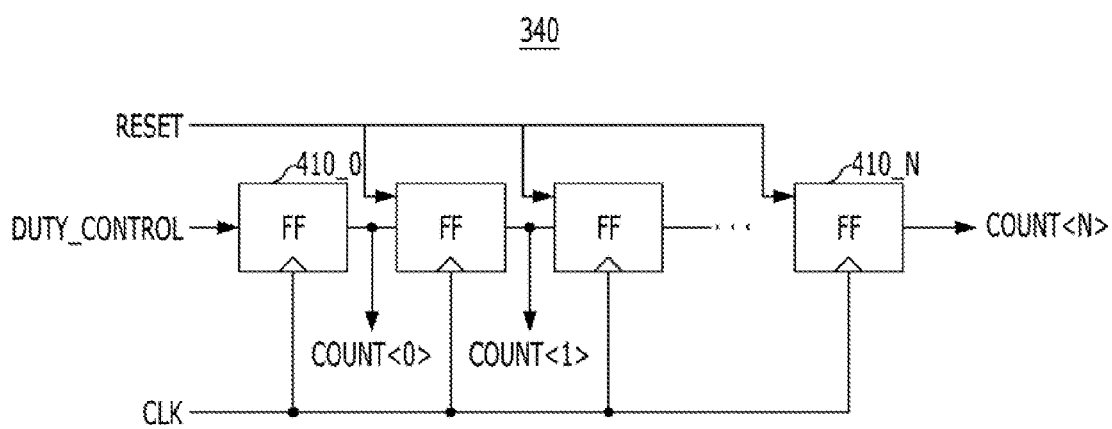
FIG. 4 is a circuit diagram illustrating a count unit shown in FIG. 3.

FIG. 4 is a circuit diagram illustrating the structure of the count unit 340 shown in FIG. 3. Referring to FIG. 4, the count unit 340 includes a plurality of flip-flops 410 corresponding to bits of the count signal COUNT<0:N>. That is, the count unit 340 may include N+1 flip-flops 410_0 to 410_N. The plurality of flip-flops 410 count the control signal DUTY_CONTROL in response to the clock CLK and output the count signal COUNT<0:N>. In the active period of the control signal DUTY_CONTROL, the plurality of flip-flops 410 increase the bit value of the count signal COUNT<0:N> in response to the clock CLK. The plurality of flip-flops 410 may be reset in response to the power up reset signal RESET of the semiconductor memory device 200.

Hereafter, the operation of the clock correction block 220 in accordance with the embodiment of the present invention will be described with reference to FIG. 5.

Figure 5:
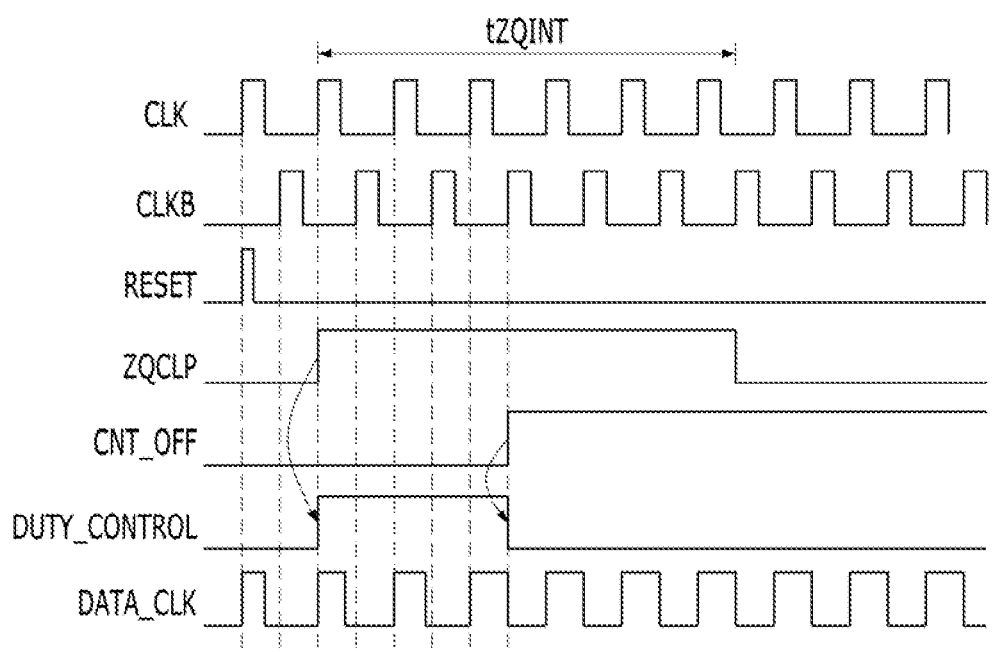
FIG. 5 is a timing diagram illustrating an operation of the clock correction block shown in FIG. 3 in accordance with the embodiment of the present invention.

FIG. 5 is a timing diagram illustrating the operation of the clock correction block 220 shown in FIG. 3 in accordance with the embodiment of the present invention.

As described in FIG. 5, the clock correction block 220 in accordance with the embodiment of the present invention generates the control signal DUTY_CONTROL in order to correct the duty ratio of the first and second internal docks CLK and CLKB. The control signal DUTY_CONTROL may be generated depending on the active period tZQINT of the ZQ calibration signal ZQCLP. The ZQ calibration signal ZQCLP is a signal generated for a ZQ calibration operation first performed after the semiconductor memory device 200 is powered up. The active period tZQINT of the ZQ calibration signal ZQCLP corresponds to a time required for the ZQ calibration operation. Since the control signal DUTY_CONTROL is activated in the period of the ZQ calibration operation, sufficient time may be secured for the duty ratio correction operation and the duty ratio of the clock may be stably corrected without increasing the peak current.

Through the duty ratio correction operation in response to the control signal DUTY_CONTROL, the pulse width of the first delay clock CLK_D is corrected based on the rising edge of the second delay clock CLKB_D. That is, the pulse width of the data clock DATA_CLK increases based on the rising edge of the second internal clock CLKB. When the falling edge of the data clock DATA_CLK corresponds to the rising edge of the second internal clock CLKB, the completion signal CNT_OFF is activated. The clock correction block 220 outputs the data clock DATA_CLK having the corrected duty ratio. The control signal DUTY_CONTROL is deactivated in response the activated completion signal CNT_OFF. The duty ratio correction operation is not performed any more, and generated values are stored and monitored.

As describe above, the dock correction block in accordance with the embodiment of the present invention is controlled depending on the operation periods of the semiconductor memory device. The duty ratio of the clock may be corrected using a signal activated in an initial operation period or a test operation period of the semiconductor memory device. Therefore, in a semiconductor memory device used in a low power system such as a mobile product, the duty ratio of the clock may be corrected by avoiding overlapping with general operations such as read/write operations. The data may be stably inputted/outputted without increasing the peak current. Even with respect to a high frequency clock for the high speed operation, the duty ratio thereof may be stably corrected to better the characteristics of data inputted/outputted to/from the semiconductor memory device.

The semiconductor memory device in accordance with the above embodiments of the present invention may correct the duty ratio of a clock signal used therein using an initialization signal or a test signal, without increasing its peak current even in a low power system.

While the present invention has been described with respect to the specific embodiments it will be apparent to those skilled in the art that various changes and modifications may be made without departing from the spirit and scope of the invention as defined in the following claims.

What is claimed is:

1. A semiconductor memory device, comprising:
   a clock input block suitable for generating first and second internal clocks in response to an external clock;
   a clock correction block suitable for generating a data clock by correcting a duty ratio of the first and second internal clocks in response to a signal activated in an initial operation mode of the semiconductor memory device; and
   a data control block suitable for controlling data in synchronization with the data clock,
   wherein the initial operation mode includes an operation mode in which the semiconductor memory device sets initial values after being powered up.

2. The semiconductor memory device of claim 1, wherein the signal activated in the initial operation mode of the semiconductor memory device includes a signal activated for a ZQ calibration operation performed directly after the semiconductor memory device is powered up.

3. The semiconductor memory device of claim 1, wherein the clock correction block is initialized in response to a power up reset signal of the semiconductor memory device.

4. The semiconductor memory device of claim 1, wherein the clock correction block generates the data clock by correcting the duty ratio of the first and second internal clocks in response to a signal activated in a test mode of the semiconductor memory device.

5. The semiconductor memory device of claim 4, wherein, in the test mode, read and write operations of the semiconductor memory device are interrupted and a clock duty ratio correction operation thereof is performed by the clock correction block.

6. The semiconductor memory device of claim 1, wherein, the clock correction block includes:
   a clock delay unit suitable for generating first and second delay clocks by delaying the first and second internal clocks based on a delay amount determined in response to a count signal;
   a clock comparison unit suitable for generating a completion signal by comparing the first and second delay clocks;
   a control unit suitable for generating a control signal in response to the completion signal and the signal activated in the initial operation mode of the semiconductor memory device; and
   a count unit suitable for generating the count signal by performing a counting operation in response to the control signal.

7. The semiconductor memory device of claim 6, wherein the control unit generates the control signal in response to a signal activated in a test mode of the semiconductor memory device.

8. The semiconductor memory device of claim 6, wherein the count unit is initialized in response to a power up reset signal of the semiconductor memory device.

9. The semiconductor memory device of claim 6, wherein the clock comparison unit outputs one of the first and second delay clocks as the data clock.

10. A method of operating a semiconductor memory device, comprising:
    generating first and second internal clocks in response to rising and falling edges of an external clock;
    correcting a duty ratio of the first and second internal clocks to generate a data clock in an initial operation mode of the semiconductor memory device; and
    controlling data in synchronization with the data clock,
    wherein the initial operation mode includes an operation mode in which the semiconductor memory device sets initial values after being powered up.

11. The method of claim 10, wherein the initial operation mode includes an operation mode for a ZQ calibration operation performed directly after the semiconductor memory device is powered up.

12. The method of claim 11, wherein, the correcting of the duty ratio of the first and second internal clocks includes:
    generating first and second delay clocks by delaying the first and second internal clocks based on a delay amount determined in response to a count signal;
    generating a completion signal by comparing the first and second delay clocks;
    generating a control signal in response to the completion signal and a signal activated for the ZQ calibration operation; and
    generating the count signal by performing a counting operation in response to the control signal.

13. The method of claim 10, further comprising:
    correcting the duty ratio of the first and second internal clocks to generate the data clock in a test mode of the semiconductor memory device.

14. The method of claim 13, wherein, in the test mode, read and write operations of the semiconductor memory device are interrupted.

15. The method of claim 14, wherein the correcting of the duty ratio of the first and second internal clocks includes:
    generating first and second delay clocks by delaying the first and second internal clocks based on a delay amount determined in response to a count signal;
    generating a completion signal by comparing the first and second delay clocks;
    generating a control signal in response to the completion signal and a signal activated in the test mode of the semiconductor memory device; and
    generating the count signal by performing a counting operation in response to the control signal.

16. A semiconductor memory device, comprising:
    a clock correction block suitable for generating a data clock by correcting a duty ratio of an input clock in an initial operation period or a test operation period of the semiconductor memory device; and
    a data control block suitable for controlling data in synchronization with the data clock,
    wherein the initial operation period begins after the semiconductor memory device is powered up.

17. The semiconductor memory device of claim 16, wherein the initial operation period ends before the semiconductor memory device performs read and write operations, wherein the semiconductor memory device sets initial values in the initial operation period.

18. The semiconductor memory device of claim 16, wherein the semiconductor memory device interrupts read and write operations in the test operation period.

* * * * *